United States Patent
Hun et al.

(10) Patent No.: US 6,355,764 B1
(45) Date of Patent: Mar. 12, 2002

(54) SOLUBLE THERMOSETTING POLYETHERSULFONE AND MAKING OF THEM

(75) Inventors: Shung-Yaw Hun, Taichung Hsien; Fu-Kang Huang, Taoyuan Hsien; Tsung-Yi Yeh, Hsinchu; Tsu Hsien Han, Miaoli Hsien; Ro Ching Liu, Hsinchu Hsien, all of (TW)

(73) Assignee: Lead Data Inc., Hsinchu Hsien (TW)

( * ) Notice: Subject to any disclaimer, the term of this patent is extended or adjusted under 35 U.S.C. 154(b) by 0 days.

(21) Appl. No.: 09/711,042

(22) Filed: Nov. 13, 2000

(30) Foreign Application Priority Data

Jan. 27, 2000 (TW) ........................................ 89101600 A

(51) Int. Cl.$^7$ ............................................... C08G 75/23
(52) U.S. Cl. ........................ 528/175; 528/171; 528/271; 528/293; 528/295; 528/373; 528/391; 528/397
(58) Field of Search ................................ 528/175, 171, 528/271, 293, 295, 373, 391, 397

(56) References Cited

U.S. PATENT DOCUMENTS

| | | | | | |
|---|---|---|---|---|---|
| 3,824,293 | A | * | 7/1974 | Brode et al. ................. | 528/173 |
| 4,156,068 | A | * | 5/1979 | Hartmann .................... | 528/175 |
| 4,598,137 | A | * | 7/1986 | Guiver et al. ................ | 528/173 |
| 4,990,252 | A | * | 2/1991 | Tomaschke et al. ... | 210/321.83 |
| 5,071,941 | A | * | 12/1991 | Lubowitz et al. ........... | 528/170 |
| 5,089,560 | A | * | 2/1992 | Gardner et al. ............. | 525/109 |
| 5,917,137 | A | * | 6/1999 | Ekiner ........................... | 96/10 |

FOREIGN PATENT DOCUMENTS

EP            193082     *   3/1986

* cited by examiner

*Primary Examiner*—Duc Truong
(74) *Attorney, Agent, or Firm*—Bucknam and Archer

(57) ABSTRACT

The invention provides a new soluble thermosetting polyethersulfone resin, which can dissolve in ether solvent such as THF and 1,4-Dioxane. The soluble thermosetting polyethersulfone resin can be introduced the unsaturated olefin functional group, after high temperature (>180° C.) curing the unsaturated olefin functional group gets high heat resistant polyethersulfone resin. The soluble thermosetting polyethersulfone resin is made by two steps reaction, the dihalodiphenylsulfone reacts with dihydroxy aromatic compound and dihydroxybenzoic acid to form carboxy group terminated polyethersulfone resin, then the carboxy group terminated polyethersulfone resin react with unsaturated olefin alcohol or glycidyl acrylate or their derivatives to make soluble thermosetting polyethersulfone resin.

12 Claims, No Drawings

SOLUBLE THERMOSETTING POLYETHERSULFONE AND MAKING OF THEM

FIELD OF THE INVENTION

Nowadays developments in electronic industries are tending towards making things lighter, thinner, more compact and rapid. Among the development trends, organic material plays an important role due to its potentials to make lighter, thinner and smaller products. Seeing this, it is apparently important for the electronic industries to develop highly functional and thermosetting organic material.

Polyethersulfone, with the properties of nice heat- and impact-resistance, can be applied in shoot-and-add processes and used as recovery material. However, just because its good heat-resistance, polyethersulfone can resolve in solvents of a high boiling point only, such as N-methylpyrrolidone, N, N-dimethylformamide etc., and cannot be processed and produced below 150° C. Furthermore, as a product of thermally moldable plastics with lower glass transition temperature (Tg) and melting point, it cannot be used, either, as adhesives for electronic industries, for instance, adhesives for Lead On Carrier (LOC), 3-layer and Double-side FPCs, and CSP motherboards. Therefore, it has become an important issue in development and research of new polyethersulfone how to improve its properties and enable it to be dissolved in solvents of low boiling point (<150° C.) and hot pressed below 200° C. without losing its high heat-resistance characteristics. As a result, the invention said hereof successfully develops a brandnew polyethersulfone that can be dissolved in such ether solvents as THF,1,4-Dioxane, etc.

With the glass transition temperature (Tg) lower than 130° C., the polyethersulfone resin developed by the invention can be hot pressed at a temperature ranged from 180° C. to 220° C. Besides, the newly developed polyethersulfone resin has unsaturated double bonds that enhance its heat-resistance ability after thermally hardened. Generally speaking, it is not suitable for thermally hardened resins to be baked at a high temperature lest that it will lose the properties gained from hot pressing. Fortunately, the invention has successfully developed a soluble thermosetting polyethersulfone resin to overcome the above-said chemical disadvantages and, at the same time, effectively improve the thermosetting ability of substances composed by polyethersulfone resin. As you can see, the invention's greatest achievement is to meet all the characteristics listed below:

(1) With polyethersulfone contain the unsaturated double bonds that raise the Tg of thermosetting polyethersulfone over than 170° C., (2) with the Tg less than 130° C. before hardened so that the polyethersulfone developed by the invention can be have the hot pressed character.

(3) making polyethersulfone resin soluble in ether solvents like THF,1,4-Dioxane so that it can be keeps its hot pressing properties even through brushed on polyethersulfone resin then heating at a lower temperature of 150° C.

(4) increasing elongation of polyethersulfone resin more than 3% after hardened at 200° C., and thus give polyethersulfone resin have certain mechanical strength. The characteristics of production that bring about the useful of adhesives for Lead On Carrier (LOC), 3-layer and Double-side FPCs, and CSP motherboards.

DESCRIPTION OF THE PRIOR ART

As a known engineering plastics, polyethersulfone resin has a better thermosetting ability than substances of the same structure such as polyethersulfone resin and polythioether resins. However, just its outstanding thermosetting considerably limits its applications in processing to an extent that it is not so often used as polybenzeylether and polythiolether resins. That's why there are rare factories that would like to produce polyethersulfone resin.

Two ways in which polyethersulfone resin is synchronized and applied are adopted at present: one is used as engineering plastics, plastic grinds and separate membrane produced via shoot-and-add processing for wear-proof, impact- and thermosetting components; the other is used in composition of recovery material to improve the impact-, heat- and moisture-resistance properties of the said recovery material for sports devices and aviation material.

As to previous know-how of polyethersulfone concerned, most of its researches are focused on synthesize of plastics of high molecular weights and different structures, and only a few on amine terminated polyethersulfone oligomer, as stated in U.S. Pat. No. 5,071,941, U.S. Pat. No. 5,917,137, U.S. Pat. No. 3,824,293, U.S. Pat. No. 5,089,560, WO Patent No.96/117,006, and EP Patent No.193,082. The above mentioned patents are all concerned about synthesize and application of polyethersulfone, but differ completely from the technology of the invention.

The subject of U.S. Pat. No. 5,071,941 is terminated cyclical-structured, unsaturated double-bond polyethersulfone oligomer. The polyethersulfone oligomer comes from hydroxyacrylamine compound formed by hydroxyldiamine compound and cyclical-structured, unsaturated double-bond acid anhydrides. However, the hardening process of such structure really takes time and, even more, this kind of production process cannot be applied to acrylic production structures.

U.S. Pat. No. 5,917,137 is applied in producing gas phase separate membrane form by polyethersulfone resin and polyimide resin. Since the polyethersulfone used in U.S. Pat. No. 5,917,137 is common marketed engineering plastics and is only one component of their subject, it is entirely different from the invention in its structure, chemical characteristics and application property.

WO Patent No.96/17,006 is focused on formation of compound material, like reinforced fiber and strong fiber, composed of thermosetting thermoplastic resin, Melamine-formaldehyde, hardener and glass fiber, with improved impact-, moisture- and thermosetting. A detailed analysis of the contents of WO Patent No.96/17,006, it can be found that polyethersulfone, polyesteramide, and polyethersulfone resin are used as thermosetting thermoplastic resin, and the three of which are all commercialized products. In WO Patent No.96/17,006, thermosetting thermoplastic resin is adopted to synchronize reinforced and strong fiber compound material, both used as the compound material for sports devices. The main difference from the invention is that the thermoplastic resin used in WO Patent No.96/17,006 does not cross-link with Melamine-formaldehyde and even no self cross-linkage occurs, but the thermoplastic resin used in the invention will cross-link with each other. Seeing this, it is apparent that the polyethersulfone of the invention already has completely different chemical characteristics. In EP Patent No. 0,193,082, amine terminated polyethersulfone oligomer, hardener, Melamine-formaldehyde and fiber cloth are used as main material to produce matrix resins for aviation compound material. The polyethersulfone oligmer used in EP Patent No.0,193,082 has a molecular weight less than 10,000 and the number of amine group in a single molecule unit less smaller than 1.4, and does not work well in cross-linkage with Melamine-formaldyhide. Even worse, this kind of amine terminated polyethersulfone oligmer cannot form a cross-linkage structure in itself. Such a cross-linkage structure may occur only in reaction with some other kinds of resins like Melamine-formaldehyde.

In U.S. Pat. No. 3,824,293, hydroxyl or thiol metallic salt, acted with reactive haloaromatic compound, is used to form thermosetting thermoplastic resins or oligmers such as polyethersulfone thioether resin, polythioethersulfone resin, and polythioethersulfone ester resin. The molecular weight of the oligmers produced in this Patent is less than 10,000, and each molecule has only two hydroxyl groups (acted with Melamine-formaldyhide). Thus, no cross-linkage is formed.

In U.S. Pat. No. 5,089,560, compound material with phase-separated and multi-phase morphology structures is produced with amine terminated polyethersulfone oligmer, acrylonitril butadiene rubber particles, Melamine-formaldehyde, hardener and fiber, etc. Because of the acrylonitrile butadiene rubber particles included, there is phase-separated phenomenon occurs and the glass transition temperature (Tg) is reduced.

From the above know-how comparison, it is remarkable that the polyethersulfone of the invention has a completely renewed structure by introducing in a brandnew way the above-said unsaturated double bonds into the typical polyethersulfone resin structure, making it totally different from thermoplastic resins and the organic functioned polyethersulfone resin. As you can see, the features of the invention are: soluble in solvents of low boiling points, Tg<130° C. before hardened, and Tg>170° C. after hardened.

SUMMARY OF THE INVENTION

The purpose of the invention is to find out a soluble thermosetting polyethersulfone resin by using a new structural design, with its heat-resistance and shoot-and-add processing greatly improved. To obtain heat-resistance up to a certain extent, polyethersulfone resin of aromatic structure is used as the main component of the chain structure in the invention. Then, a side-chain structure-the aliphatic unsaturated double bonds, is introduced into the structure of polyethersulfone resin. By this way, the thermally hardening polyethersulfone resin can be acquired, which is soluble in ethyl ether solvents, thermosetting and able to be hot pressed.

The polyethersulfone resin of the invention is made via a delicately designed producing process by using commercialized chemicals as its material. In the invention, we employ dihalodiphenylsulfone reacted with aromatic dihydroxyphenyl compounds to form a special kind of polyethersulfone resin that has hydroxycarboxy groups at its primary chain structure; and then, taking use of the special acting properties of the hydroxycarboxyl, epoxy and hydroxy groups, to form unsaturated double bonds at the molecular side chains.

Any one who is familiar with the above-said knowhow will get a clear image of the strong and weak points of the invention disclosed hereof after reading the detailed illustrations of the preferred demonstration diagrams below.

BRIEF DESCRIPTION OF THE DRAWINGS

The invention will now be described by way of example with reference to the accompanying Tables in which:

Table 1 : Features of hydroxycarboxyl polyethersulfone resin

Table 2 : N1–N4 soluble thermosetting polyethersulfone

Table 3 : N5–N9 soluble thermosetting polyethersulfone

Table 4 : properties of soluble thermosetting polyethersulfone

DETAILED DESCRIPTION OF THE INVENTION

The invention successfully exploit a soluble thermosetting polyethersulfone resin, which have three characteristics such as can be dissolved in ethyl ether solvents, hot-pressed and thermosetting at a high temperature. The invention can be dissolved in some ethyl ether solvents like THF, 1,4-Dioxane, and thus fits the coating conditions required while baked at a low temperature. As it is a kind of thermosetting resin, the invention has a lower Tg before hardened, and may thus be applied in molding and hot pressing. Besides, the Tg of our production will considerably increased near 170° C. after a thermal treatment process, so it does have good heat-resistance and may be widely applied as adhesives in hot pressing. Thanks to its molecular weight larger than 15,000, the invention always has a good performances of high heat-resistance and mechanical strength no matter before or after baked, or after hot pressed. The characteristics of production that bring about the useful of adhesives for Lead On Carrier (LOC), 3-layer and Double-side FPCs, and CSP motherboards.

The subject of the invention is synchronized by way of two stages: first, prepare the polyethersulfone resin (molecular weight>15,000 ) via the reaction of aromatic dihydroxyphenyl compounds and dihalodiphenylsulfone. Then, the carbonate functioned groups included in such polyethersulfone will react with hydroxyl compounds or acrylic epoxy propylene ester, both with unsaturated double bonds, to form unsaturated double-bond polyethersulfone resin.

The production of the invention includes two steps:

(1) synthesize of hydroxycarboxyl polyethersulfone: dissolve dihalodiphenylsulfone, aromatic dihydroxyphenyl compounds, and dihydroxybenzoic acid, respectively weighed according to a certain proportion, in a inorganic soda and organic solvent, then reacted at 120° C.~200° C. for 12~48 hours;

(2) lead unsaturated double bonds into sulfone structure: the carboxyl polyethersulfone were prepared at the first process step, that react with acrylic epoxy propylene ester at 100° C.~140° C. for 2~8 hours (or via esterification of carboxyl polyethersulfone and unsaturated double bond hydroxyl compounds).

The material of the above said polyethersulfone resin includes: dihalodiphenylsulfone, aromatic dihydroxyphenyl compounds, dihydroxy acid, inorganic soda, organic solvent, acrylic epoxy propylene ester, unsaturated double bond hydroxyl compounds, and dehydrating agent. The structure of dihalodiphenylsulfone is shown as Formula 1, in which X stands for fluorine, chlorine, bromine, or iodine that X are on the any position of the benzene ring.

Formula 1

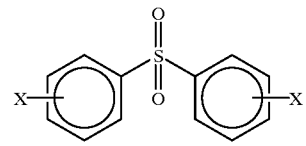

The structure of aromatic dihydroxyphenyl compounds used in the invention is shown as Formula 2, in which Y stands for alternatives of other aromatic compounds.

HO—Y—OH    Formula 2

The other aromatic compounds such as 2,2-bis(4-hydroxyphenyl)propane, 1,1-bis(hydroxyphenyl)-1-phenylethane, resorcinol, xyleneglycol, bis(4-hydroxyphenyl)sulfide, bis(4-hydroxyl-3-methylphenyl) sulfide, 2,2-bis(4-hydroxy-3-methylphenyl)propane, bis(4-hydroxyphenyl)sulfone, catechol, biphenol, bis(hydroxyphenyl)ether, bis(hydroxyphenyl)methane, hydroquinone,a,a'-bis(4-hydroxyphenyl)-1,4-diisopropylbenzene, dihydroxynaphthalene, methylcatechol, methylhydroquinone, methylresorcinol, dihydroylbenzophenone etc.

The structure of dihydroxybenzoic acid used in the invention is shown as Formula 3, in which the position of dihydroxyphenyl groups may be 2,3-'2,4-'2,5-'2,6-'3,4- or 3,5 on the benzene ring.

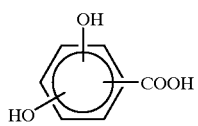

Formula 3

Usually the inorganic soda used as a hardener for polyethersulfone resin in synthesized are hydroxide, carbonate or bicarbonate compounds of alkaline or alkali earth, metals. The mole ratio of aromatic diphenyl compound and plus dihydroxybenzoic acid should be within the range of 1:0.9 to 1:1.1, and the molecular weight ranging from 15,000 to 40,000. The mole ratio of aromatic dihydroxyphenyl compound and dihydroxybenzoic acid is between 1.0 and 15; the inorganic soda is two times the diphenyl groups in moles; and the organic solvent which controls the solid content within 20%~70% may be polar or non-polar solvents or mixtures of the two, among which the polar solvents are N-methylpyrrolidone, N,N-dimethylformamide, N,N-dimethylacetamide, and dimethyl sulfoxide. The non-polar solvents are benzene, Toluene, xylene, Trimethyl benzene, Naphthalene, and their derivatives.

The acrylic epoxy propylene ester used in the invention may be any one of the substances listed below: acrylic epoxy propylene ester, methyl acrylic epoxy propylene ester, ethyl acrylic epoxy propylene ester, acrylic epoxy butylene ester, methyl acrylic epoxy butylene ester, dimethyl acrylic epoxy butylene ester, and their derivatives.

The unsaturated double bond hydroxyl compound used in the invention may be: any unsaturated double bond hydroxyl compound whose carbon number is lower than 7, such as 3-hydroxyl propylene, 3- or 4-hydroxyl butylene, 4-hydroxyl 2-butylene, 3-, 4- or 5-hydroxyl pentene, 4- or 5-hydroxyl 2-butylene, etc. And the dehydrating agent may be DCC reagent, sulfuric acid, benzylsulfonic acid, and p-benzylsulfonic acid.

The subject of the invention can be used as dielectric insulation material, that prepared from reactions of carboxyl side-chained polyethersulfone resins and unsaturated double-bond hydroxyl compounds or acrylic epoxy propylene esters. The side chain structure, formed by introducing carboxyl groups into the structure of polyethersulfone resins, is the primary structure design for the hydroxycarboxyl polyethersulfone. And the hydroxycarboxyl groups are obtained from reaction of dihydroxybenzoic acid and dihalodiphenylsulfone. According to the above-mentioned methods, we can employ carboxyl side-chained polyethersulfone resin reacting with acrylic epoxy propylene ester at 100~140° C. for 2~8 hrs, or carboxyl polyethersulfone resin reacting with unsaturated double-bond hydroxyl compounds, to produce soluble thermosetting polyethersulfone resin.

Dosage of dihalodiphenylsulfone (Formula 1), aromatic hydroxyphenyl compounds (Formula 2), and dihydroxybenzoic acid (Formula 3) in the invention is set as per the requirements of various products. For example, reaction of "n" moles of dihalodiphenysulfone (Formula 1) and "m" moles of aromatic dihydroxyphenyl compounds (Formula 2) can obtain n-m moles of intermediate products (Formula 4). Thus, we have two alternatives process, process A and B, to complete the reaction.

In process A: first, react "n" moles of dihalodiphenylsulfone (Formula 1) with "m" moles of aromatic dihydroxyphenyl compounds (Formula 2) to obtain the intermediate products (Formula 4). Second, react the intermediate products with n-m-1 or m-m+1 moles of dihydroxybenzoic acid (Formula 3) to form carboxyl side-chained polyethersulfone resin (Formula 5), and then react the polyethersulfone resin (Formula 5) with acrylic epoxy propylene ester (Formula 6) or unsaturated double-bond hydroxyl compound (Formula 7) to obtain the final soluble thermosetting polyethersulfone resin (Formula 8).

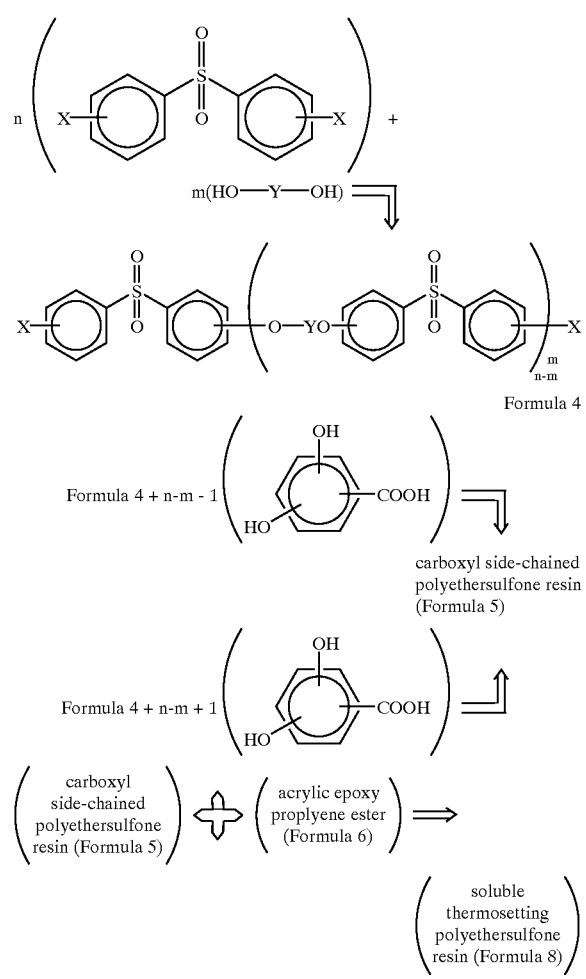

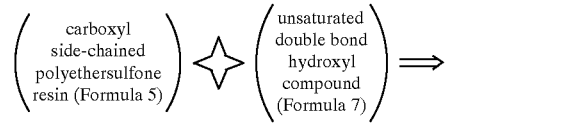

In process B: first, react randomly nmoles of dihalodiphenylsulfone (Formula 1), m moles of aromatic dihydroxyphenyl compound (Formula 2) and n-m-1 or n-m+1 moles of dihydroxybenzoic acid (Formula 3) to form another type of carboxyl side-chained polyethersulfone resin (random carboxyl side-chained polyethersulfone resin, Formula 9), and then, react either the polyethersulfone resin (Formula 9) with acrylic epoxy propylene ester (Formula 6) or unsaturated double-bond hydroxyl compound (Formula 7) also can obtain the soluble thermosetting polyethersulfone resin (formula 10). The above cited "n" and "m" should be greater than 1.1 and "n" value greater than "m".

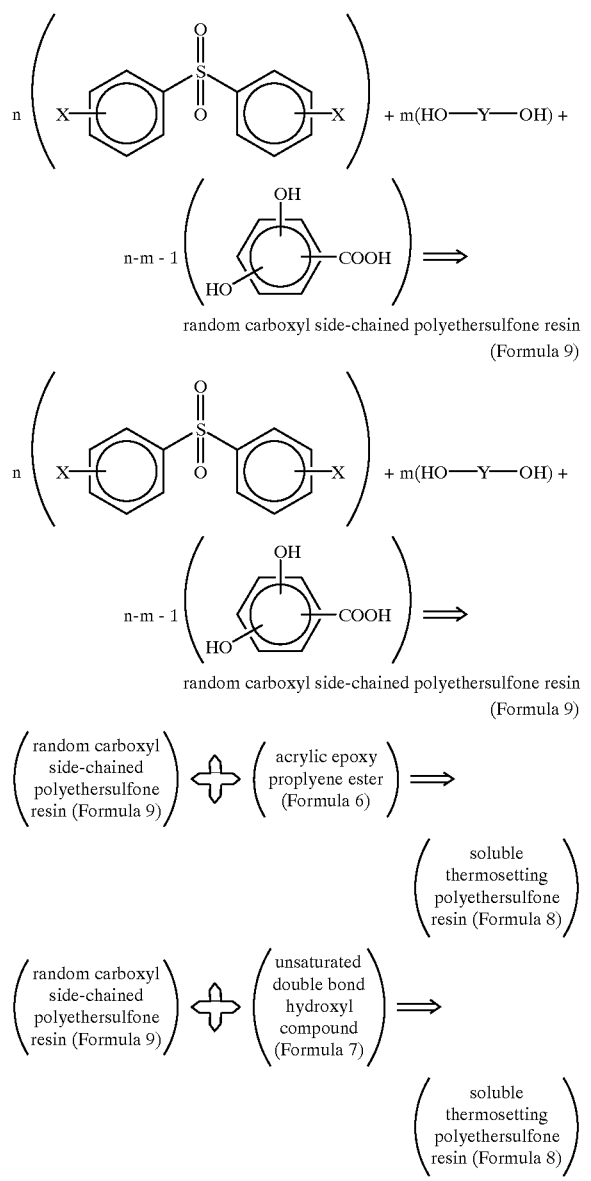

For production the carboxyl polyethersulfone resin and soluble thermosetting polyethersulfone resin were obtained according to the above said methods. The physics datum are list on Table 1, that would be get through the follow methods. The molecular weights were determined with GPC-THF Layer Analyzing Column. The glass transition temperatures of the invention with TMA Heat Analyzer (Universal V2.3C TA Instrument). The cracking temperatures were determined with TGA Heat Analyzer (DuPont 2000). All the glass transition temperatures of the synchronized polyethersulfone are lower than 130° C., and will turn out to be over 170° C. after hardened at 200° C.

To put it in a word, this polyethersulfone resin is an creative, innovative, and revolutionary invention. Although some preferred demonstrations are shown here, the applications of the invention are not limited to them. Any one who is familiar with the techniques said above can more or less amend or polish up the contents of the invention without going beyond the spirits and coverage of the invention. Therefore, the Coverage of the invention should be deemed as defined in the Application attached.

Some preferred demonstrations are disclosed below to further illuminate the production method and the effects of the invention, but not to limit the application coverage of the invention.

Example 1

Synthesize of Polyethersulfone Resin Containing Carboxyl Groups (Formula-5)

Equip a one-liter round-bottom three-neck flask with a mechanical blender, a water remover, and a Dean-Stark trap. Put in 103.32 g dichlorodiphenylsulfone, 54.72 g 2,2-bis(4-hydroxyphenyl)propane), 101.016 g potassium bicarbonate, 40 g toluene and 64.764 g N-methylpyrrolidone, into the flask. At the beginning, heat to 120° C., and blend for 1 hour; then continue heating to 180 ° C. and blend again for 24 hours. Pour the thick viscous liquid obtained from reaction into water while cooling down to the ambient temperature, and the potassium salt coming from the hardener of polyethersulfone resin will deposit. Acidify with solution of hydrochloric acid, and finally wash 2 or 3 times with water. After purified and dried, the polyethersulfone resin H1 is thus obtained. According to the ratio shown in Table 1, weigh out the required dosage of dichlorodiphenylsulfone, aromatic dihydroxyphenyl compounds, dihydroxybenzoic acid, potassium bicarbonate, toluene, and N-methylpyrrolidone, undergo experiments as illustrated, and you will obtain various polyethersulfone resins H1 to H5.

Example 2–5

Introduction of Unsaturated Double Bonds

Dissolve 60 g H1 into 140 g DMAC, and add 14.203 g GMA and 2.142 g 2-ethyl-4-methylimidazole (2E4MZ). Heat to 120° C. and let react for 6 hrs. Pour the thick viscous liquid obtained from reaction into water for deposit. After purification and drying, the required resin N1 is obtained. With the same method, dissolve polyethersulfone resin H2–H4 in DMAC as per the ratios shown in Table 2, then react with GMA, 2-ethyl-4-methylimidazole (2E4MZ), and you can obtain N1–N4 in turn.

Example 6–8

Dissolve 30 g solid polyethersulfone resin H4 with dry DMAC, add 4.93 g DCC, 0.1943G Dimethylaminopyridine (DMAP) and 2.49 g HEMA, and blend for 48 hrs with air isolated. Resin N5, after purified, is then obtained. According to different ratios shown in Table 3, N6 and N7 can be prepared in the same way.

Example 9–10

Dissolve 30 g solid polyethersulfone resin H4 in dry DMAC, add 4.93 g DCC, 0.1943 g 4-Dimethylaminopyridine and 1.1112 g Ally alcohol, and blend for 48 hrs with air isolated. Resin N8, after purified, is then obtained. According to different ratios shown in Table 3, N9 can be prepared in the same way.

Comparison Example 1

Use the marketed thermoplastic polyethersulfone resin A300 (AMOCO) as a sample. Test its properties directly.

Comparison Example 2

In contrast, use the thermoplastic polyethersulfone resin synchronized by ourselves as a sample. Equip a 1-litre round-bottom three-neck flask with a mechanical blender, a water remover, and a Dean-Stark trap. Put 86.1 g dichlorodiphenylsulfone, 69.768 g 2,2-bis(4-hydroxyphenyl) propane), 83.628 g potassium bicarbonate, 40 g toluene and 59.87 g N-methylpyrrolidone into the flask, heat to 120° C. and blend for 1 hour. Then continue heating to 180° C. and blend for 48 hrs. Until the thick and viscous liquid obtained form reaction cools down to the ambient temperature, pour it into water, acidify with solution of hydrochloric acid, and finally wash 2 or 3 times with water. The required polyethersulfone resin is obtained.

TABLE 1

Features of hydroxycarboxyl polyethersulfone resin

| polyethersulfone | H1 | 112 | H3 | H4 | H5 |
|---|---|---|---|---|---|
| dichlorodiphenylsulfone | 103.32 | 129.15 | 129.15 | 129.15 | 229.6 |
| 2,2-bis(4-hydroxyphenyl) propane | 54.72 | 82.08 | 34.2 | 41.04 | — |
| dibenzyl phenol | — | — | 27.9 | 33.48 | 99.2 |
| dihdroxybenzoic acid | 20.33 | 15.25 | 24.49 | 15.25 | 43.53 |
| potassium bicarbonate | 101.02 | 125.44 | 125.44 | 125.44 | 223 |
| toluene | 40 | 40 | 40 | 40 | 40 |
| N-methylpyrrolidone (g) | 64.76 | 84.17 | 72.20 | 82.30 | 142.92 |
| molecular weights | 47117 | 37157 | 89704 | 41197 | 44366 |
| Tg (° C.) | 183.32 | 177.20 | 196.77 | 199.25 | 204.77 |

Notes:
1. Use a 1 * 10 cm sheet to test the anti-pulling strength and stretching rate
2. Use a ⅛" wide copper foil to test the anti-tearing strength at an angle of 90 degrees
3. Use a heat-analyzer to measure the cracking temperature and figure out its residues' temperature. Measure again if the residues' temperature is over 800° C..

TABLE 2

N1–N4 soluble thermosetting polyethersulfone

| production | N1 | N2 | N3 | N4 |
|---|---|---|---|---|
| polyethersulfone resin/g | H1/60 | H2/100 | H3/60 | H4/30 |
| GMA | 14.203 | 21.78 | 14.82 | 6.812 |
| DMAC | 140 | 233.33 | 140 | 70 |
| 2E4MZ | 2.142 | 3.55 | 2.15 | 1.227 |
| molecular weights | 47117 | 32383 | 21522 | 35846 |
| THF | Soluble | soluble | soluble | soluble |
| 1,4-Dioxane | Soluble | soluble | soluble | soluble |

TABLE 3

N5–N9 soluble thermosetting polyethersulfone

| | N5 | N6 | N7 | N8 | N9 |
|---|---|---|---|---|---|
| polyethersulfone resin/g | H4/30 | H5/30 | H3/30 | H4/30 | H3/30 |
| DMAC | 120 | 120 | 120 | 120 | 120 |
| HEMA | 2.49 | 4.23 | 4.067 | — | — |
| Ally alcohol | — | — | — | 1.1112 | 1.8157 |
| DCC | 4.9335 | 8.3753 | 8.06 | 4.9335 | 8.06 |
| DMAP | 0.1943 | 0.3307 | 0.3183 | 0.1943 | 0.3183 |
| molecular weights | 34758 | 44618 | 82984 | 35074 | 91231 |

TABLE 3-continued

N5–N9 soluble thermosetting polyethersulfone

|  | N5 | N6 | N7 | N8 | N9 |
|---|---|---|---|---|---|
| THF | Soluble | soluble | soluble | soluble | soluble |
| 1,4-Dioxane | Soluble | soluble | soluble | soluble | soluble |

TABLE 4 properties of soluble thermosetting polyethersulfone

|  | N1 | N2 | N3 | N4 | N5 | N6 | N7 | N8 | N9 | Comparison on example 1 | Comparison on example 2 |
|---|---|---|---|---|---|---|---|---|---|---|---|
| Stress (kg/mm$^2$) | 3.85 | 7.24 | 5.67 | 9.42 | 8.46 | 6.53 | 7.87 | 4.37 | 8.72 | 9.77 | 6.21 |
| Elongation (%) | 3.66 | 7.56 | 6.00 | 10.54 | 7.14 | 7.18 | 7.72 | 4.64 | 7.78 | 8.44 | 4.24 |
| Peel strength (lb/in) | 7.92 | 11.03 | 11.73 | 6.37 | 6.6 | 8.55 | 7.42 | 10.39 | 5.68 | 2.78 | 2.34 |
| Pre cure Tg (° C.) | 104.23 | 123.30 | 79.38 | 104.56 | 112.77 | 94.01 | 99.65 | 125.24 | 125.91 | — | — |
| Gel time/sec (170° C.) | 24" | 30" | 27" | 20" | 45" | 36" | 13" | 38" | 20" | 0 | 0 |
| Post cure Tg** | 170.37 | 182.15 | 183.18 | 188.96 | 177.08 | 171.87 | 198.22 | 187.64 | 189.70 | 219.33 | 169.79 |
| Decompose temperature (° C.) | 380.86 | 487.63 | 398.32 | 424.10 | 451.27 | 469.58 | 489.52 | 472.95 | 487.11 | 569.5 | 434.39 |
| Char yield % | 23.53 | 35.33 | 33.81 | 41.79 | 32.41 | 41.99 | 31.19 | 37.31 | 34.25 | 39.34 | 39.95 |

What is claimed is:

1. A dielectric insulation material made of polyethersulfone resin that is soluble in ethers solutions, able to be hot pressed, and high thermosetting, this kind of polyethersulfone resin containing unsaturated double bonds is prepared in the following way: first, let dihalodiphenylsulfone, aromatic dihydroxyphenyl compound, dihydroxybenzoic acid and inorganic soda react at 140–200° C. for 24–48 hrs to form the intermediate product-carboxyl polyethersulfone resin; then react the intermediate product with acrylic epoxy propylene ester at 100–140° C. for 2–8 hrs (or undergo esterification of the carboxyl polyethersulfone and unsaturated double-bond hydroxyl compounds).

2. The dielectric insulation material made of polyethersulfone resin claimed in claim 1, which intermediate product—carboxyl polyethersulfone resin is prepared from carboxyl polyethersulfone resin including: react dihalodiphenylsulfone, aromatic dihydroxyphenyl compound, and inorganic soda at 140–200° C. for 6–24 hrs, then add dihydroxybenzoic acid, and react again for 6–24 hrs.

3. The dielectric insulation material made of polyethersulfone resin claimed in claim 1, which intermediate product—carboxyl polyethersulfone resin is prepared from carboxyl polyethersulfone resin including: react dihalodiphenylsulfone, aromatic dihydroxyphenyl compound, inorganic soda and dihydroxybenzoic acid, at 140–200° C. react for 6–24 hrs.

4. The dielectric insulation material made of polyethersulfone resin claimed in claim 1, which intermediate product—carboxyl polyethersulfone resin comprising the mole ratio of dihalodiphenylsulfone and aromatic dihydroxyphenyl compound plus dihydroxybenzoic acid is between 0.9 and 1.1 in the intermediate product of carboxyl polyethersulfone resin, and the molecular weight of the product is between 15,000 and 100,000.

5. The dielectric insulation material made of polyethersulfone resin claimed in claim 1, which the soluble thermosetting polyethersulfone can be obtained from the reaction of the intermediate product of carboxyl polyethersulfone resin with acrylic epoxy propylene ester at 100–140° C. for 2–8 hrs or from esterification of carboxyl polyethersulfone resin and unsaturated double-bond hydroxyl compounds, among which, the mole ratio of acrylic epoxy propylene ester (of unsaturated double-bond hydroxyl compound) and dihydroxybenzoic acid is 1:1 to 1.5:1.

6. The dielectric insulation material made of polyethersulfone resin claimed in claim 1, which intermediate product—carboxyl polyethersulfone resin comprising the mole ratio of aromatic dihydroxyphenyl compound and dihydroxybenzoic acid in the intermediate product of carboxyl polyethersulfone resin is between 1.0 and 15.

7. The dielectric insulation material claimed in claim 1, the structure of the diholodiphenylsulfone is shown as the formula 1, in which X stands for fluorine, chlorine, bromine and iodine, and may be replaced by more than one elements at any benzene ring.

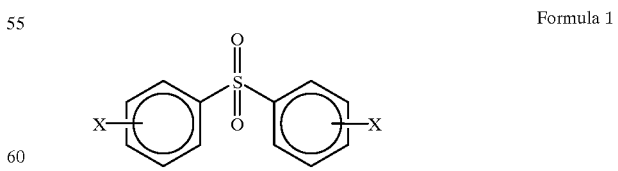

Formula 1

8. The dielectric insulation material claimed in claim 1, which aromatic dihydroxyphenyl compound is shown as the formula 2 in which Y stands for alternatives of other aromatic compounds

HO—Y—OH    Formula 2

The other aromatic compounds such as 1,1-bis(hydroxyphenyl)-1-phenylethane, xyleneglycol, resorcinol, 2,2-bis(4-hydroxyphenyl)propane, bis(4-hydroxyphenyl)sulfide, bis(4-hydroxyl-3-methylphenyl)sulfide, 2,2-bis(4-hydroxy-3-methyl-phenyl)propane, bis(4-hydroxyphenyl)sulfone, catechol, biphenol, dihydroxynaphthalene, bis(hydroxyphenyl)ether, hydroquinone, a,a'-bis(4-hydroxyphenyl)-1,4-diisopropylbenzene, methylresorcinol, methylcatechol, bis(hydroxyphenyl)methane, dihydroylbenzophenone, methylhydroquinone, etc.

9. The dielectric insulation material claimed in claim 1, which dihydroxybenzoic acid is shown as the Formula

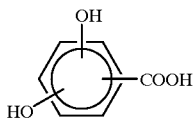

in which the position of dihydroxyphenyl groups may be 2,3-'2,4-'2,5-'2,6-'3,4- or 3,5 on the benzene ring.

10. The dielectric insulation material claimed in claim 1, which the inorganic soda can be the hydroxide of alkali metals or alkaline earth metals, carbonate compounds, or bicarbonate compounds.

11. The dielectric insulation material claimed in claim 1, which the acrylic epoxy propylene ester can be acrylic epoxy propylene ester, methyl acrylic epoxy propylene ester, ethyl acrylic epoxy propylene ester, acrylic epoxy butylene ester, methyl acrylic epoxy butylene ester, dimethyl acrylic epoxy butylene ester, and their derivatives.

12. The dielectric insulation material claimed in claim 1, which the unsaturated double-bond hydroxyl compounds may be any unsaturated double bond hydroxyl compound whose carbon number is lower than 7, such as 3-hydroxyl propylene, 3- or 4-hydroxyl butylene, 4-hydroxyl 2-butylene, 3-, 4- or 5-hydroxyl pentene, 4- or 5-hydroxyl 2-butylene, etc., and their derivatives.

* * * * *

UNITED STATES PATENT AND TRADEMARK OFFICE
CERTIFICATE OF CORRECTION

PATENT NO.    : 6,355,764 B1                                           Page 1 of 1
DATED         : March 12, 2002
INVENTOR(S)   : Sheng Yaw Hsu et al.

It is certified that error appears in the above-identified patent and that said Letters Patent is hereby corrected as shown below:

<u>Title page,</u>
Item [75], should read,
-- [75] Inventors:  Sheng Yaw Hsu, Taichung Hsien; Fu-Kang Huang, Taoyuan Hsien; Tsung-Yi Yeh, Hsinchu; Tsu Hsien Han, Miaoli Hsien; Bo Ching Liu, Hsinchu Hsien, all of (TW) --

Signed and Sealed this

Fourth Day of February, 2003

JAMES E. ROGAN
*Director of the United States Patent and Trademark Office*